(12) United States Patent
Park et al.

(10) Patent No.: US 8,795,943 B2
(45) Date of Patent: Aug. 5, 2014

(54) NEGATIVE PHOTORESIST COMPOSITION AND PATTERNING METHOD FOR DEVICE

(75) Inventors: Chan-Hyo Park, Daejeon (KR); Kyung-Jun Kim, Daejeon (KR); Yu-Na Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 354 days.

(21) Appl. No.: 13/100,773

(22) Filed: May 4, 2011

(65) Prior Publication Data
US 2011/0274853 A1    Nov. 10, 2011

(30) Foreign Application Priority Data

May 4, 2010    (KR) .................. 10-2010-0042057

(51) Int. Cl.
*G03F 7/00* (2006.01)
*G03F 7/004* (2006.01)
*G03F 7/40* (2006.01)

(52) U.S. Cl.
USPC ........ 430/270.1; 430/913; 430/905; 430/927; 430/330; 430/331

(58) Field of Classification Search
USPC .............. 430/270.1, 913, 927, 905
See application file for complete search history.

(56) References Cited

U.S. PATENT DOCUMENTS

| | | | |
|---|---|---|---|
| 5,807,947 A * | 9/1998 | Vicari et al. | 526/313 |
| 6,558,869 B1 * | 5/2003 | McCullough et al. | 430/270.1 |
| 6,673,512 B1 * | 1/2004 | Uenishi et al. | 430/270.1 |
| 6,838,229 B2 * | 1/2005 | Washio et al. | 430/324 |
| 7,517,619 B2 * | 4/2009 | Hosaka et al. | 430/7 |
| 7,521,168 B2 | 4/2009 | Mitzutani et al. | |
| 7,601,482 B2 * | 10/2009 | Pawlowski et al. | 430/285.1 |
| 2003/0165772 A1 * | 9/2003 | Takahashi et al. | 430/270.1 |
| 2005/0014086 A1 * | 1/2005 | Eswaran et al. | 430/270.1 |

FOREIGN PATENT DOCUMENTS

| | | |
|---|---|---|
| EP | 0458325 A1 | 11/1991 |
| JP | 05-241342 A | 9/1993 |
| JP | 2861344 B2 | 12/1998 |
| JP | 2005-514659 A2 | 5/2005 |
| JP | 2008-112186 A | 5/2008 |
| JP | 2010169944 A * | 8/2010 |
| TW | I292853 B | 1/2008 |
| WO | 03/058347 A1 | 7/2003 |

OTHER PUBLICATIONS

Machine translation of JP 05-241342 (no date).*
International Search Report issued in International Appln. No. PCT/KR2011/003306 dated Jan. 18, 2012, 9 pages.

* cited by examiner

*Primary Examiner* — Amanda C. Walke
(74) *Attorney, Agent, or Firm* — Rothwell, Figg, Ernst & Manbeck, P.C.

(57) ABSTRACT

The present invention relates to a negative photoresist composition and a patterning method for device in which a photoresist pattern having a high sensitivity with a good reverse taper profile can be formed not only to realize an effective patterning of various thin films but also to facilitate removal of the photoresist pattern after the patterning. The photoresist composition comprises an alkali-soluble binder resin; a halogen-containing first photo-acid generator; a triazine-based second photo-acid generator; a cross-linking agent having an alkoxy structure; and a solvent.

18 Claims, 2 Drawing Sheets

NEGATIVE PHOTORESIST COMPOSITION AND PATTERNING METHOD FOR DEVICE

TECHNICAL FIELD

The present invention relates to a negative photoresist composition and a patterning method for device, and more particularly, to a negative photoresist composition and a patterning method for device using the same in which a photoresist pattern having high sensitivity with a good reverse taper profile is formed not only to realize effective patterning of various thin films but also to facilitate removal of the photoresist pattern after the patterning.

The present application claims priority to Korean patent application no. 10-2010-0042057 filed on May 4, 2011. The content of the foregoing application is incorporated herein by reference.

BACKGROUND OF ART

The process for device, such as light-emitting diode or DRAM, includes a photolithography process for patterning a variety of thin films. For the photolithography process, there are used a photoresist composition and photoresist patterns formed from the photoresist composition. There are two types of photoresist compositions: positive and negative.

The negative photoresist composition is a photoresist composition of which the unexposed portions are removed when a substrate or a target thin film undergoes photoresist coating, exposure and development. Such a negative photoresist composition is generally used for patterning metal films, such as electrodes, in fabrication of various devices, such as light-emitting diodes (LEDs) or liquid crystal devices (LCDs). More specifically, the use of the negative photoresist composition has been considered in the fabrication process for LCD thin film transistor substrate or in the lift-off process for forming LED electrodes.

The lift-off process refers to a method of creating patterns in which the negative photoresist composition is used to form a photoresist pattern with reverse taper profile, which is then used to pattern a target thin film, such as a metal film. However, the use of the conventional negative photoresist composition in forming photoresist patterns frequently fails to provide photoresist patterns with a reverse taper profile. In this case, when the target thin film, such as a metal film, is formed on the photoresist pattern, residuals of the target thin film (e.g., metal residuals) often accumulate on the sidewalls of the photoresist pattern. These residuals become a potential cause of a short circuit between electrodes formed from the metal film and end up with defects in the device.

Furthermore, the conventional negative photoresist composition exhibits sensitivity not high enough to achieve effective and good patterning of the target thin film, such as a metal film. Particularly, this problem becomes more prominent due to the recent tendencies in a variety of devices towards high integration and micronization.

SUMMARY OF THE INVENTION

It is therefore an object of the present invention to provide a negative photoresist composition that not only exhibits high sensitivity but also enables creation of good photoresist patterns with reverse taper profile.

It is another object of the present invention to provide a patterning method for device using the negative photoresist composition.

The present invention provides a negative photoresist composition that comprises: an alkali-soluble binder resin; a halogen-containing first photo-acid generator; a triazine-based second photo-acid generator; a cross-linking agent including an alkoxy structure; and a solvent.

The present invention also provides a patterning method for device that comprises: applying the negative photoresist composition on a substrate; exposing a defined region of the composition applied on the substrate; developing the composition in unexposed portions to form a photoresist pattern with a reverse taper profile; forming a target thin film on the photoresist pattern; and removing the photoresist pattern.

DETAILED DESCRIPTION OF THE EMBODIMENTS

Hereinafter, a description will be given as to a negative photoresist composition and a patterning method for device according to the exemplary embodiments of the present invention.

In accordance with one embodiment of the present invention, there is provided a negative photoresist composition that comprises: an alkali-soluble binder resin; a halogen-containing first photo-acid generator; a triazine-based second photo-acid generator; a cross-linking agent including an alkoxy structure; and a solvent.

The negative photoresist composition comprises two types of photo-acid generators of a specified series. As will be known in the later-described examples, the experiments performed by the inventors of the present invention revealed that, due to the two photo-acid generators, the negative photoresist composition of the present invention not only exhibits high sensitivity but also enables formation of good photoresist patterns with reverse taper profile. For example, the photoresist pattern may be formed to have a good reverse taper profile that the sidewalls of the photoresist pattern and the substrate form an angle of less than 90°, specifically at least 55° and less than 90°, more specifically between 55° to 80°.

With such a good reverse taper profile, the photoresist pattern may be used to effectively pattern a variety of target thin films, such as metal films, through the lift-off process and to minimize a short circuit of metal films or electrodes or defects in the device during the patterning process. This is because the good reverse taper profile can almost prevent residuals of the target thin films, such as metal residuals, from accumulating on the sidewalls of the photoresist pattern. Hence, the negative photoresist composition may be desirably applied to the fabrication process for various devices, such as LED or LCD devices, including, for example, the fabrication of a thin film transistor substrate for LCD device, or the formation of electrodes for LED device. As there is no residual of the target thin film accumulating on the sidewalls of the photoresist pattern, the photoresist pattern can be removed more easily later, which is the main cause that reduces defects in the device.

In contrast to this, the negative photoresist composition containing photo-acid generators of different series, or a single photo-acid generator, when applied to the lift-off process, may result in a deterioration of sensitivity or fail to form a photoresist pattern with reverse taper profile; in many cases, the photoresist pattern is created in a taper form or an almost like rectangular form, or the pattern is not formed due to deteriorated sensitivity. For that reason, when such a photoresist pattern is used in patterning a target thin film such as metal film, a considerable amount of residuals may accumulate on the sidewalls of the photoresist pattern. The residuals remain on the substrate after the patterning process to cause a short circuit of electrodes formed from the metal films or a difficulty of creating good patterns, resulting in defects in the device. The accumulated residuals may also make it difficult to remove the photoresist pattern, which causes defects in the device.

What causes the negative photoresist composition according to an embodiment of the present invention to have the above-described functions can be predicted as follows.

The negative photoresist composition comprises a compound containing halogen, such as fluorine, as a first photo-acid generator. When coating the substrate with the negative photoresist composition, the first photo-acid generator is usually distributed more on the top portion of the composition due to the halogen component. Upon exposure and bake (i.e., post exposure bake) on the composition coating, a large amount of acids is generated relatively from the top portion of the exposed composition to form a cross-linked structure. In the subsequent development process, the composition in unexposed portions is removed, so the width of the photoresist pattern remaining in exposed portions becomes larger on the top of the pattern than on the bottom. In this manner, using the photoresist composition may result in a photoresist pattern with a good reverse taper profile.

The negative photoresist composition may also use a triazine-based composition as a second photo-acid generator. The triazine-based second photo-acid generator plays a role in the exposure and development process to enhance the sensitivity of the negative photoresist composition. This facilitates the formation of a delicate negative photoresist pattern with reverse taper profile.

Hereinafter, a description will be given as to the respective component ingredients and detailed compositions of the negative photoresist composition according to an embodiment of the present invention.

The negative photoresist composition comprises an alkali-soluble binder resin, which basically has the property to dissolve in an alkali solution, such as a developer solution. But, in exposed portions, the binder resin reacts with a cross-linking agent via acids generated from the first and second photo-acid generators to form a cross-linked structure and becomes insoluble to an alkali solution. Due to this property of the binder resin, upon exposure and development, the unexposed portions of the negative photoresist composition are selectively removed to leave a photoresist pattern with reverse taper profile.

Such a binder resin may comprise any polymer that is basically soluble to an alkali solution and reacts with a cross-linking agent via acids to form a cross-linked structure. Examples of the binder resin as used herein may comprise a polymer that reacts with an alkoxy structure of the cross-linking agent via acids to form a cross-linked structure, such as a novolac- or polyhydroxystyrene-based polymer. More specifically, the novolac-based polymer may be a copolymer represented by the following formula 1, with a weight average molecular weight of about 3,000 to 30,000, preferably about 4,000 to 15,000, more preferably about 5,000 to 10,000.

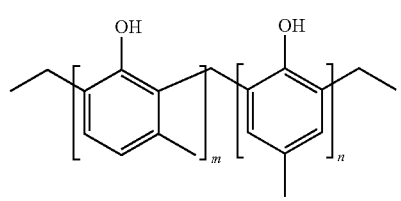

[Formula 1]

where m and n represent the degree of polymerization of each repeating unit, where m:n=1:9 to 9:1.

The polyhydroxystyrene-based polymer may be a polymer represented by the following formula 2, with a weight average molecular weight of about 500 to 10,000, preferably about 1,000 to 7,000, more preferably about 1,500 to 5,000.

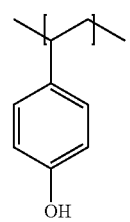

[Formula 2]

The use of a novolac- or polyhydroxystyrene-based polymer having a molecular weight within the above-defined range enables the composition containing the binder resin to exhibit appropriate alkali solubility and good developability and to form a proper cross-linked structure under exposure, thereby creating good photoresist patterns.

In addition to the novolac- or polyhydroxystyrene-based polymer, the composition may also use, as a binder resin, any polymer that is alkali-soluble and reactive to the alkoxy structure of a cross-linking agent to form a cross-linked structure and thus known to be used for the conventional negative photoresist composition.

The halogen-containing first photo-acid generator as included in the negative photoresist composition may be a fluorine-containing photo-acid generator, more specifically, an aminosulfonate-based photo-acid generator containing halogen, such as fluorine. The use of the first photo-acid generator helps a photoresist pattern created with a reverse taper profile. The specified example of the halogen-containing aminosulfonate-based photo-acid generator may comprise a compound represented by the following formula 3. Besides, any other photo-acid generators may be appropriately chosen as the first photo-acid generator with the proviso that it contains halogen and thus becomes distributed more on the top portion of the negative photoresist composition applied on the substrate.

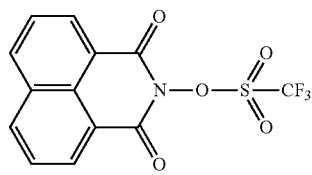

[Formula 3]

The triazine-based second photo-acid generator included in the negative photoresist composition may be any triazine-based photo-acid generator, more specifically, a compound represented by the following formula 4. The use of the second photo-acid generator may enhance the sensitivity of the negative photoresist composition and facilitate the use of a photoresist pattern with reverse taper profile. Besides, any other known triazine-based photo-acid generators may be used as the second photo-acid generator.

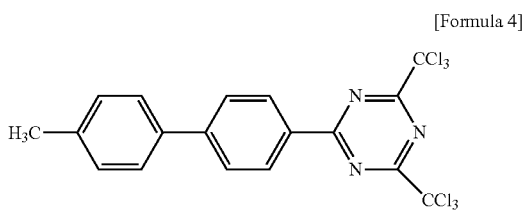

[Formula 4]

On the other hand, the negative photoresist composition comprises a cross-linking agent having an alkoxy structure. Due to the alkoxy structure, the cross-linking agent reacts with the hydroxyl groups of the binder resin, such as the novolac- or polyhydroxystyrene-based polymer, to form a cross-linked structure. More specifically, the cross-linking agent reacts with the acids generated from the first and second photo-acid generators to provide a carbonium salt, which reacts with the hydroxyl groups of the binder resin to form a cross-linked structure. In this manner, the cross-linking agent provides the exposed portions of the photoresist composition with a cross-linked structure and makes the exposed portions insoluble to a developer solution to leave a photoresist pattern with reverse taper profile.

The cross-linking agent may comprise a compound having at least two alkoxy structures, such as, for example, a melamine- or urea-based compound having a plurality of alkoxy structures. The specified example of the cross-linking agent may comprise a compound represented by the following formula 5.

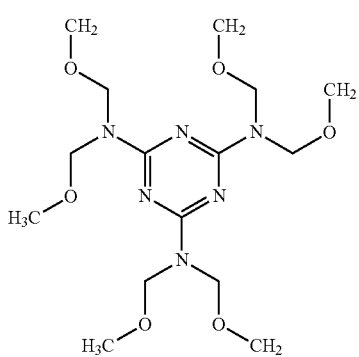

[Formula 5]

The use of the cross-linking agent enables formation of an appropriate cross-linked structure between the binder resin and the cross-linking agent in exposed portions and, after development, makes the photoresist composition of the exposed portions left to form an appropriate photoresist pattern. Besides, any other compound having an alkoxy structure may also be used as the cross-linking agent.

The solvent included in the negative photoresist composition is a medium for dissolving the other component ingredients and may comprise different kinds of solvents as used for the conventional photoresist composition. The examples of the solvent may include, but not specifically limited to, ethyl lactate, propylene glycol methyl ether acetate (PGMEA), N-methyl-2-pyrrolidone, N,N-dimethylacetamide, dimethylformamide (DMF), dimethylsulfoxide (DMSO), acetonitrile, diglyme, γ-butyrolactone, phenol, or cyclohexanone; or mixtures of at least two of these solvents. Preferably, the solvent is propylene glycol methyl ether acetate (PGMEA).

In addition to these component ingredients, the photoresist composition may also comprise different additives, such as, for example, dye, speed enhancer, or surfactant. The dye as used herein may include, but not specifically limited to, any dye commercially available and known to be useful for photoresist compositions. The surfactant as used herein may include a silicon-based surfactant, such as BYK-based surfactant, and any other surfactants known to be useful for photoresist compositions.

The speed enhancer is a component that is distributed among the binder resin particles to make the photoresist composition in unexposed portions more easily removed by the developer solution. In other words, the speed enhancer having a relatively low molecular weight is distributed among the binder resin particles to prevent the binder resin having a relatively high molecular weight from being gathered in clusters, so the photoresist composition in unexposed portions can be more easily dissolved in the developer solution and removed.

The speed enhancer may comprise a phenol novolac-based compound having a similar structure to that of the binder resin, such as, for example, a compound represented by the following formula 6.

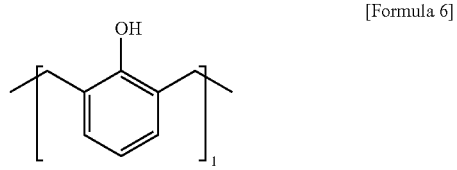

[Formula 6]

where l is the degree of polymerization of a repeating unit, ranging from 2 to 10.

Besides, the photoresist composition may also comprise any other speed enhancers appropriately selected depending on the type of the binder resin.

The negative photoresist composition may have a solid content but the solvent in the range of 10 to 40 wt. %. This enables the individual component ingredients to uniformly dissolve in the composition and to maintain an appropriate concentration, thereby contributing to creation of a proper photoresist pattern.

The negative photoresist composition may comprise a binder resin in an amount of about 7 to 30 wt. %, preferably about 10 to 27 wt. %, more preferably about 15 to 25 wt. %; a first photo-acid generator in an amount of about 0.1 to 5 wt. %, preferably about 0.2 to 3 wt. %, more preferably about 0.3 to 1.5 wt. %; a second photo-acid generator in an amount of about 0.01 to 5 wt. %, preferably about 0.02 to 1 wt. %, more preferably about 0.02 to 0.1 wt. %; a cross-linking agent in an amount of about 1 to 10 wt. %, preferably about 2 to 7 wt. %, more preferably about 2 to 5 wt. %; and additives and a solvent for the rest of the content. The respective component ingredients are used at the above-defined contents to form a photoresist pattern with good reverse taper profile.

Due to the function of each component ingredients, the negative photoresist composition in exposed portions is left to form a photoresist pattern, and the negative photoresist composition in unexposed portions is removed by the developer solution. Particularly, the negative photoresist composition is useful to form a photoresist pattern with good reverse taper profile and hence can be very desirably applied to the patterning of various target thin films through the lift-off process. For example, the negative photoresist composition may be properly used for patterning different thin films in fabrication of LCDs or LEDs, preferably in the fabrication of thin film transistor substrates and the patterning of metal films such as electrodes.

In accordance with another embodiment of the present invention, there is provided a patterning method for device using the negative photoresist composition through a lift-off process. The pattern method for device using a lift-off process comprises: applying the negative photoresist composition on a substrate; exposing a defined region of the coated composition; developing the composition in unexposed portions to form a photoresist pattern with a reverse taper profile; forming a target thin film on the photoresist pattern; and removing the photoresist pattern.

An exemplary process of the patterning method is illustrated in a schematic diagram of FIG. 1. Referring to FIG. 1, in the patterning method, a substrate is coated with the photoresist composition and subjected to exposure and development to form a photoresist pattern. The photoresist pattern thus obtained may have a good reverse taper profile as described above. For example, the photoresist pattern has such a good reverse taper profile that the substrate and the sidewalls of the photoresist pattern form an angle of less than 90°, specifically at least 55° and less than 90°, more specifically in the range from 55° to 80°. Metal is then deposited on the photoresist pattern to form a target thin film, such as a metal film. Due to the reverse taper profile, the residuals of the target thin film, such as metal residuals, do not accumulate on the sidewalls of the photoresist pattern but selectively remain on the photoresist pattern and the substrate on which no pattern is formed. Subsequently, the photoresist pattern is removed to leave the target thin film, thereby forming a pattern of the target thin film, such as a pattern of the metal film.

Here, the pattern formed from the negative photoresist composition according to the embodiment of the present invention has a good reverse taper profile, which consequently reduces the amount of the residuals of the target thin film, such as metal residuals, accumulated on both sidewalls of the pattern. This contributes to a good patterning of the target thin film without a risk of causing a short circuit of the target thin film, such as the metal film, and enables the photoresist pattern to be more easily removed. Consequently, the use of the negative photoresist composition according to the embodiment of the present invention enables a good patterning of the target thin film, such as the metal film, through the lift-off process and greatly reduces potential defects in the device pertaining to a short circuit of the metal film.

The patterning method for device may further comprise a prebake (prior to exposure) and/or post exposure bake process. This bake process is to more effectively form a cross-linked structure between the binder resin and the cross-linking agent.

The prebake process is carried out, for example, at about 80 to 120° C., preferably about 90 to 110° C., and the post exposure bake process is carried out, for example, at about 90 to 150° C., preferably about 90 to 110° C. Controlling the temperature condition of each bake process within the above-defined range is to optimize the cross-linked structure and to help the photoresist pattern formed with reverse taper profile.

In the patterning method for device, the exposure is performed using a light source having a wavelength of 365 to 436 nm, such as, for example, an i- or g-line light source (monochromatic or white light source). As the negative photoresist composition according to the embodiment of the present invention contains two different photo-acid generators, a photoresist pattern or a pattern of the target thin film can be formed with high sensitivity even when using different light sources having a wide range of wavelength. This enhances the margin of the exposure process and also increases the applicability of the lift-off process.

The exposure process may be carried out with an exposure energy of about 20 to 120 mJ/cm$^2$, preferably about 30 to 100 mJ/cm$^2$. The exposure energy condition controlled within the above range optimizes the cross-linked structure and facilitates formation of a photoresist pattern with reverse taper profile.

After the development, the photoresist pattern is formed to have a good reverse taper profile that the substrate and the sidewalls of the photoresist pattern form an angle of less than 90°, specifically at least 55° and less than 90°, more specifically from 55° to 80°. Such a good reverse taper profile of the photoresist pattern prevents accumulation of residuals on the sidewalls. This not only facilitates a patterning of the target thin film, such as a metal film, through the lift-off process but also allows the photoresist pattern to be removed more easily.

In addition, the conditions for the prebake and/or post exposure bake process are controlled to form the photoresist pattern with different reverse taper profiles under control. This enables a proper photoresist pattern to be formed depending on the type of the target thin film patterned and greatly enhances the efficiency of the device fabrication process.

As described above, the negative photoresist composition of the present invention not only exhibits high sensitivity but also can be used to form a good photoresist pattern with reverse taper profile. Such a photoresist composition may be used in the lift-off process to effectively pattern different thin films, such as electrodes, in the fabrication process for a variety of devices, such as LCDs or LEDs. In particular, the use of the negative photoresist composition realizes formation of a good photoresist pattern with reverse taper profile and reduces residuals accumulating on the sidewalls of the pattern, thereby making the photoresist pattern more easily removed after the patterning.

Using the negative photoresist composition may enhance sensitivity and enable the use of different light sources to improve the process margin.

EXAMPLES

Figure 1:
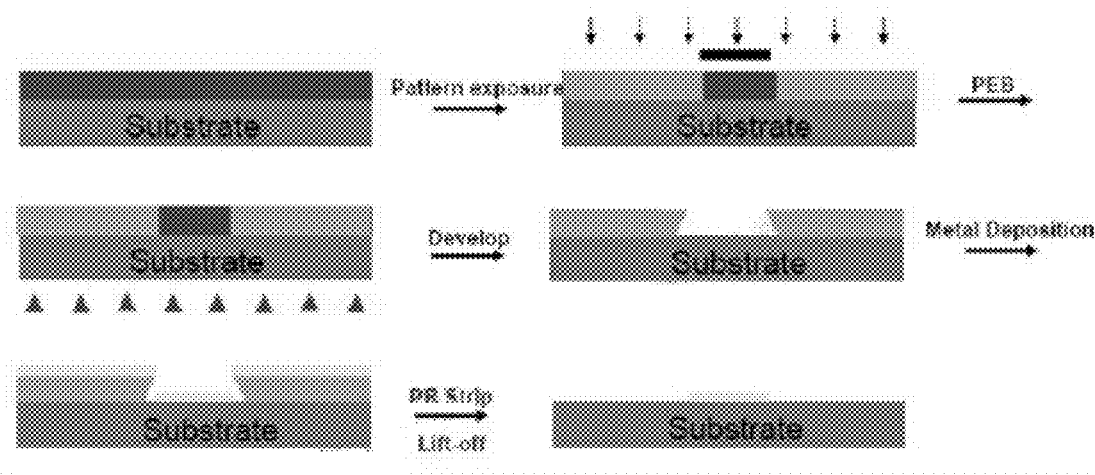
FIG. 1 is a schematic flowchart showing an exemplary process of a patterning method for device according to another embodiment of the present invention.

Hereinafter, the present invention will be described in further detail with reference to the following examples, which are presented as exemplary only and not intended to limit the scope of the present invention.

Preparation Example 1

Preparation of Negative Photoresist Composition

There were mixed 24.08 wt. % of a novolac-based polymer (Mw: 6,000; m:n=6:4) of the formula 1, 8.03 wt. % of a speed enhancer of the formula 6 (I=8), 0.96 wt. % of a photo-acid generator of the formula 3, 0.03 wt. % of a photo-acid generator of the formula 4, 2.57 wt. % of a cross-linking agent of the formula 5, 0.26 wt. % of a green dye, 0.075 wt. % of a silicon-based surfactant (BYK333), and a PGMEA solvent for the rest of the content, to prepare a negative photoresist composition.

Preparation Example 2

Preparation of Negative Photoresist Composition

There were mixed 30 wt. % of a polyhydroxystyrene-based polymer (Mw: 10,000) of the formula 2, 5 wt. % of a speed enhancer of the formula 6 (I=8), 1 wt. % of a photo-acid generator of the formula 3, 0.5 wt. % of a photo-acid generator of the formula 4, 3 wt. % of a cross-linking agent of the formula 5, 0.26 wt. % of a green dye, 0.075 wt. % of a silicon-based surfactant (BYK333), and a PGMEA solvent for the rest of the content, to prepare a negative photoresist composition.

Preparation Example 3

Preparation of Negative Photoresist Composition

There were mixed 24.08 wt. % of a novolac-based polymer (Mw: 8,000; m:n=6:4) of the formula 1, 8.03 wt. % of a speed enhancer of the formula 6 (I=8), 1 wt. % of a photo-acid generator of the formula 3, 0.5 wt. % of a photo-acid generator of the formula 4, 2.57 wt. % of a cross-linking agent of the formula 5, 0.26 wt. % of a green dye, 0.075 wt. % of a silicon-based surfactant (BYK333), and a PGMEA solvent for the rest of the content, to prepare a negative photoresist composition.

Preparation Example 4

Preparation of Negative Photoresist Composition

There were mixed 24.08 wt. % of a novolac-based polymer (Mw: 6,000; m:n=7:3) of the formula 1, 8.03 wt. % of a speed enhancer of the formula 6 (I=8), 1 wt. % of a photo-acid generator of the formula 3, 0.5 wt. % of a photo-acid generator of the formula 4, 2.57 wt. % of a cross-linking agent of the formula 5, 0.26 wt. % of a green dye, 0.075 wt. % of a silicon-based surfactant (BYK333), and a PGMEA solvent for the rest of the content, to prepare a negative photoresist composition.

Comparative Preparation Example 1

Preparation of Negative Photoresist Composition

The procedures were performed with the same composition to prepare a photoresist composition in the same manner as described in Preparation Example 1, excepting that the photo-acid generator of the formula 3 was not used.

Comparative Preparation Example 2

Preparation of Negative Photoresist Composition

The procedures were performed with the same composition to prepare a photoresist composition in the same manner as described in Preparation Example 1, excepting that the photo-acid generator of the formula 4 was not used.

Comparative Preparation Example 3

Preparation of Negative Photoresist Composition

The procedures were performed with the same composition to prepare a photoresist composition in the same manner as described in Preparation Example 1, excepting that triphenylsulfonium trifluoromethane sulfonate based on onium salt was used instead of the photo-acid generator of the formula 4.

Examples 1 to 4 and Comparative Examples 1, 2 and 3

Formation of Photoresist Pattern

A silicon wafer was spin-coated as thick as 3.0 μm with each of the photoresist compositions of Preparation Examples 1 to 4 and Comparative Preparation Examples 1, 2 and 3, and then subjected to prebake at 80° C. for 90 seconds. Exposure was then performed with an exposure energy of 70 mJ/cm$^2$ using exposure equipment (Nikon NSR i-line Stepper). Subsequently, the substrate was subjected to post exposure bake at 110° C. for 60 seconds, and the unexposed portions were developed with a 2.38% TMAH alkali developer solution to form a photoresist pattern.

Figure 2:
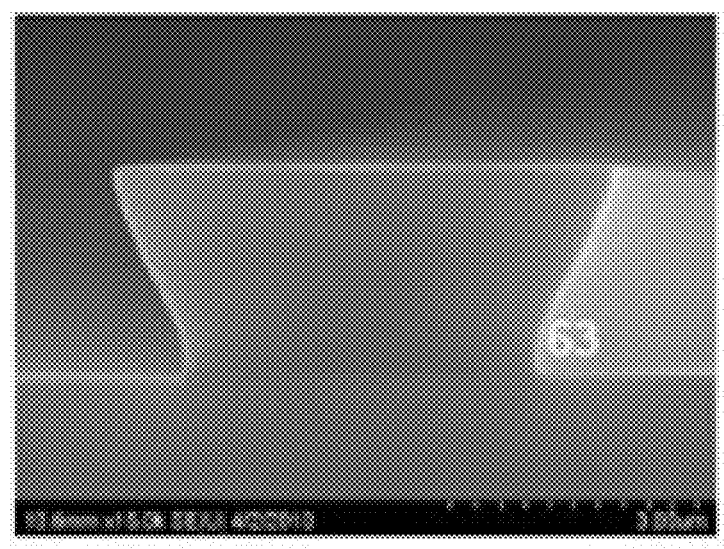
FIG. 2 is an electron microscopic (EM) image of a photoresist pattern with reverse taper profile as formed in Example 1.

The EM image of the photoresist pattern of Example 1 as formed from the photoresist composition of Preparation Example 1 is shown in FIG. 2. The CD (Critical Dimension) size of each photoresist pattern and the angle between the sidewalls of the pattern and the substrate are presented in Table 1.

TABLE 1

|  | Example | | | | Comparative Example | | |
|---|---|---|---|---|---|---|---|
|  | 1 | 2 | 3 | 4 | 1 | 2 | 3 |
|  | Preparation Example | | | | Comparative Preparation Example | | |
| Composition | 1 | 2 | 3 | 4 | 1 | 2 | 3 |
| Angle (°) | 63 | 65 | 62 | 59 | No Pattern | No Pattern | 21 |
| CD (μm) | 6.1 | 6.1 | 6.0 | 6.0 | 0 | 0 | 1.7 |

Referring to Table 1 and FIG. 2, the use of the photoresist compositions of Preparation Examples 1 to 4 ended up with a photoresist pattern having high sensitivity with a good reverse taper profile.

Contrary to this, the use of the photoresist compositions of Comparative Examples 1, 2 and 3 failed to form patterns with reverse taper profile or greatly reduced sensitivity, consequently with a great deterioration in the CD of the photoresist pattern, as demonstrated in Comparative Examples 1 and 2.

Examples 5 and 6

Formation of Photoresist Pattern

To form a photoresist pattern of Example 5, procedures were performed in the same manner as described in Example 1 using the photoresist composition of Preparation Example 1, excepting that the prebake temperature was 90° C. with an exposure energy of 30 mJ/cm².

To form a photoresist pattern of Example 6, procedures were performed in the same manner as described in Example 5, excepting that the post exposure bake temperature was 100° C. with an exposure energy of 90 mJ/cm².

Figure 3:
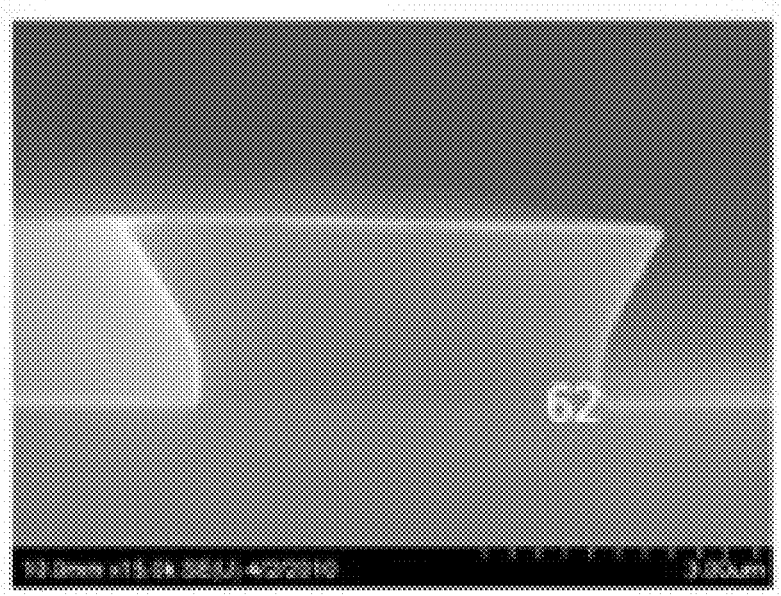
FIG. 3 is an EM image of a photoresist pattern with reverse taper profile as formed in Example 5.
Figure 4:
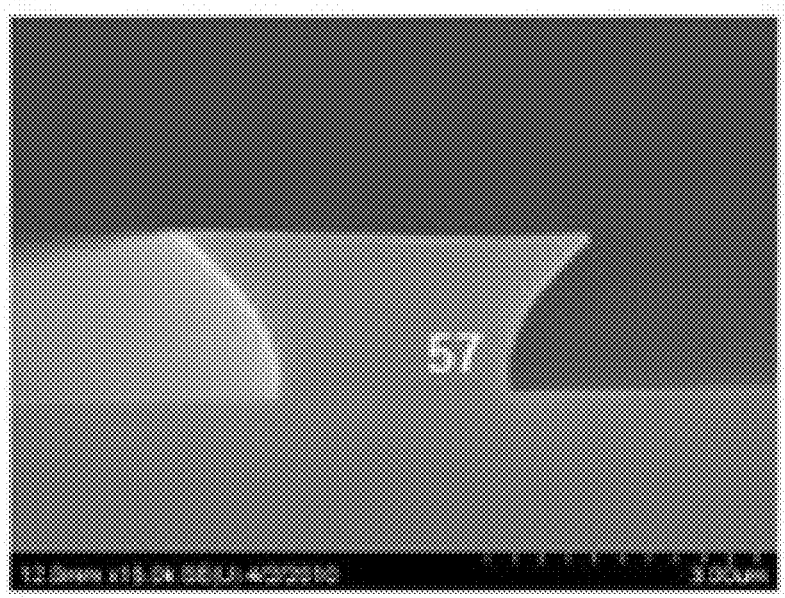
FIG. 4 is an EM image of a photoresist pattern with reverse taper profile as formed in Example 6.

The EM images of the photoresist patterns of Examples 5 and 6 are shown in FIGS. 3 and 4, respectively. The CD size of each photoresist pattern and the angle between the sidewalls of the pattern and the substrate are presented in Table 2.

TABLE 2

|  | Example 5 | Example 6 |
|---|---|---|
| Composition | Preparation Example 1 | Preparation Example 1 |
| Angle (°) | 62 | 57 |
| CD (μm) | 6.1 | 4.6 |

Referring to FIG. 1 and Table 1 as well as Table 2 and FIGS. 3 and 4, the use of the photoresist composition of Preparation Example 1 resulted in a photoresist pattern with a good reverse taper profile under different conditions for prebake and post exposure bake with different exposure energies. Furthermore, it was possible to control the reverse taper profile of the pattern by controlling the exposure energy and the prebake and post exposure bake conditions.

The invention claimed is:

1. A negative photoresist composition comprising:
   an alkali-soluble binder resin;
   a halogen-containing first photo-acid generator;
   a triazine-based second photo-acid generator;
   a cross-linking agent having an alkoxy structure;
   a speed enhancer comprises a phenol novolac-based compound represented by Formula 6:

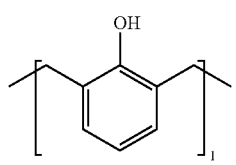

[Formula 6]

wherein l represents a degree of polymerization of a repeating unit and ranges from 2 to 10; and
   a solvent.

2. The negative photoresist composition as claimed in claim 1, wherein the binder resin comprises a novolac-based polymer or a polyhydroxystyrene-based polymer.

3. The negative photoresist composition as claimed in claim 2, wherein the novolac-based polymer comprises a copolymer having a weight average molecular weight of 3,000 to 30,000 and being represented by Formula 1:

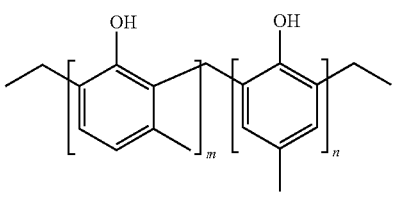

[Formula 1]

wherein m and n represent the degree of polymerization of each repeating unit, wherein m:n=1:9 to 9:1.

4. The negative photoresist composition as claimed in claim 2, wherein the polyhydroxystyrene-based polymer comprises a polymer having a weight average molecular weight of 500 to 10,000 and being represented by Formula 2:

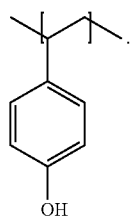

[Formula 2]

5. The negative photoresist composition as claimed in claim 1, wherein the first photo-acid generator comprises a halogen-containing iminosulfonate-based photo-acid generator.

6. The negative photoresist composition as claimed in claim 5, wherein the first photo-acid generator comprises a compound represented by Formula 3, and the second photo-acid generator comprises a compound represented by formula 4:

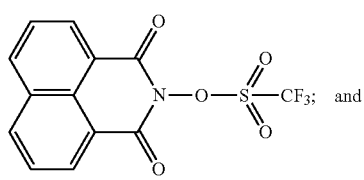

[Formula 3]

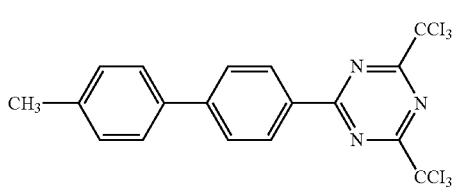

[Formula 4]

7. The negative photoresist composition as claimed in claim 1, wherein the cross-linking agent comprises a melamine- or urea-based compound having at least two alkoxy structures.

8. The negative photoresist composition as claimed in claim 7, wherein the cross-linking agent comprises a compound represented by Formula 5:

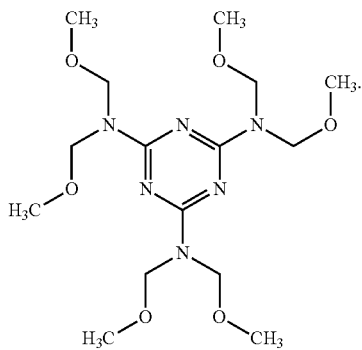

[Formula 5]

9. The negative photoresist composition as claimed in claim 1, wherein the solvent comprises at least one organic solvent selected from the group consisting of ethyl lactate, propylene glycol methyl ether acetate (PGMEA), N-methyl-2-pyrrolidone, N,N-dimethylacetamide, dimethylformamide (DMF), dimethylsulfoxide (DMSO), acetonitrile, diglyme, γ-butyrolactone, phenol, and cyclohexanone.

10. The negative photoresist composition as claimed in claim 1, further comprising at least one additive selected from the group consisting of a dye, and a surfactant.

11. The negative photoresist composition as claimed in claim 1, wherein the negative photoresist composition has a solid content of 10 to 40 wt. %.

12. The negative photoresist composition as claimed in claim 1, wherein the negative photoresist composition comprises 7 to 30 wt. % of the binder resin; 0.1 to 5 wt. % of the first photo-acid generator; 0.01 to 5 wt. % of the second photo-acid generator; 1 to 10 wt. % of the cross-linking agent; 0.075 to 8.365 wt %. of an additive; and
a solvent for the rest.

13. A patterning method for device using a lift-off process, comprising:
applying the negative photoresist composition according to claim 1 on a substrate;
exposing a defined region of the applied composition;
developing the composition of unexposed portions to form a photoresist pattern with a reverse taper profile;
forming a target thin film on the photoresist pattern and the substrate; and
removing the photoresist pattern.

14. The patterning method for device as claimed in claim 13, further comprising:
performing a prebake process and/or a post exposure bake process.

15. The patterning method for device as claimed in claim 14, wherein the prebake process is performed at 80 to 120° C., the post exposure bake process being performed at 90 to 150° C., preferably about 90 to 110° C.

16. The patterning method for device as claimed in claim 13, wherein the photoresist pattern formed after development has an angle between the substrate and the sidewall thereof in the range of at least 55° and less than 90°.

17. The patterning method for device as claimed in claim 13, wherein the exposure is performed using a light source having a wavelength of 365 to 436 nm.

18. The patterning method for device as claimed in claim 17, wherein the exposure is performed with an exposure energy of 20 to 120 mJ/cm$^2$.

* * * * *